United States Patent
Ho Simon et al.

(10) Patent No.: US 6,284,603 B1
(45) Date of Patent: Sep. 4, 2001

(54) FLASH MEMORY CELL STRUCTURE WITH IMPROVED CHANNEL PUNCH-THROUGH CHARACTERISTICS

(75) Inventors: Chan Tze Ho Simon; Tyrone Philip Stodart; Sung Rae Kim; Yung-Tao Lin, all of Singapore (SG)

(73) Assignee: Chartered Semiconductor Manufacturing Inc., Milpitas, CA (US)

( * ) Notice: Subject to any disclaimer, the term of this patent is extended or adjusted under 35 U.S.C. 154(b) by 0 days.

(21) Appl. No.: 09/614,555

(22) Filed: Jul. 12, 2000

(51) Int. Cl.[7] .................. H01L 21/8247; H01L 21/336
(52) U.S. Cl. .................. 438/264; 438/257; 438/302; 438/983
(58) Field of Search .................. 257/315, 316, 257/314, 321; 438/257, 302, 983, 259–267, 593, 594

(56) References Cited

U.S. PATENT DOCUMENTS

| | | | |
|---|---|---|---|
| 4,794,565 | * 12/1988 | Wu et al. ............................ | 365/185 |
| 5,147,811 | 9/1992 | Sakagami ............................ | 437/35 |
| 5,190,887 | 3/1993 | Tang et al. ............................ | 437/43 |
| 5,286,665 | * 2/1994 | Muragishi et al. ................ | 437/44 |
| 5,355,006 | 10/1994 | Iguchi ............................ | 257/296 |
| 5,483,487 | * 1/1996 | Sung-Mu ........................ | 365/185.33 |
| 5,518,942 | * 5/1996 | Shrivastava ........................ | 437/143 |
| 5,652,447 | * 7/1997 | Chen et al. ........................ | 257/315 |
| 5,759,896 | 6/1998 | Hsu ............................ | 438/264 |
| 5,770,502 | 6/1998 | Lee ............................ | 438/264 |
| 5,783,457 | 7/1998 | Hsu ............................ | 437/35 |
| 5,891,774 | 4/1999 | Ueda et al. ........................ | 438/264 |
| 5,998,263 | 12/1999 | Sekariapuram et al. ........... | 438/259 |
| 6,214,666 | * 4/2001 | Mehta ............................ | 438/257 |

* cited by examiner

Primary Examiner—Michael S. Lebentritt
(74) Attorney, Agent, or Firm—George O. Saile; Rosemary L.S. Pike

(57) ABSTRACT

A new method of fabricating a Flash EEPROM memory cell is achieved. Ions are optionally implanted into said semiconductor substrate to form threshold enhancement regions of the same type as the semiconductor substrate. A tunneling oxide is formed. A first conductive layer is deposited. An interpoly oxide layer is deposited. A second conductive layer is deposited. The second conductive layer, the interpoly oxide layer, the first conductive layer, and the tunneling oxide layer are patterned to form control gates and floating gates. Ions are implanted to form drain junctions. A mask protects the planned source junctions. The drain junctions are opposite type to the semiconductor substrate. Ions are implanted to form source junctions. A mask protects the drain junctions. The source junctions are opposite type to the semiconductor substrate. Ions are implanted to form channel stop junctions to complete the Flash EEPROM memory cells. The ion implantation is performed at a non-perpendicular angle with respect to the substrate. The channel stop junctions contain the source junctions. The channel stop junctions are opposite type to the semiconductor substrate. A mask protects the drain junctions.

20 Claims, 6 Drawing Sheets

FLASH MEMORY CELL STRUCTURE WITH IMPROVED CHANNEL PUNCH-THROUGH CHARACTERISTICS

BACKGROUND OF THE INVENTION (1) Field of the Invention

The invention relates to a method of fabricating semiconductor structures, and more particularly, to a method of fabricating a FLASH EEPROM device with improved channel punch-through characteristics.

(2) Description of the Prior Art

Flash EEPROM memories are widely used in the electronics industry. Many applications require the ability to change and retain data after removing the system power. Flash EEPROM offers this capability.

One type of Flash EEPROM cell is called a Fowler-Nordheim (FN) tunneling cell because electron injection across the tunneling oxide is described by the FN process. In an FN Flash EEPROM, a large gate to drain overlap is required to create sufficient electron injection efficiency. This means that a relatively deep drain junction is formed.

As the Flash EEPROM cell size is reduced, however, the distance between the deep drain junction and the source junction is reduced. The voltage at which punch-through between drain and source occurs is likewise reduced. If the punch-through voltage is too low, the cell is not useful in a circuit.

To eliminate the punch-through problem for the short channel Flash EEPROM, a threshold implant is performed. Referring now to FIG. 1, a partially completed prior art Flash EEPROM cell is shown. Isolation regions 14 are formed in the semiconductor substrate 10 to define the active area for the device. An implanting oxide 18 has been formed overlying the semiconductor substrate 10. Ions are implanted 22 into the semiconductor substrate 10 to form a threshold enhancement region 26 near the surface of the semiconductor substrate 10. The threshold enhancement region 26 is of the same impurity or dopant type as the semiconductor substrate 10. For example, if the semiconductor substrate 10 is p-type, then the threshold enhancement region 26 is also p-type. The threshold enhancement region 26 would have a higher p-type concentration than the semiconductor substrate 10.

Referring now to FIG. 2, a gate stack is defined overlying the semiconductor substrate 10. The gate stack comprises a tunneling oxide layer 30, a floating gate 34, an interpoly dielectric layer 38, and a control gate 42. A shallow source junction 50 is formed in the semiconductor substrate 10. A drain junction 48 and 46 is formed in the semiconductor substrate 10. The drain junction is typically formed much deeper that than source junction 50 to facilitate the FN tunneling effect. The drain junction may comprise a double-diffused structure where a deep drain 48 contains a shallow drain 46. The drain junction 48 and 46 and the source junction 50 are formed of the opposite type to the semiconductor substrate 10.

The presence of the threshold enhancement region 26 increases the voltage threshold of the device. This tends to increase the punch-through voltage as desired. Unfortunately, the increased threshold voltage can cause device performance problems. In addition, this is not a particularly efficient means of reducing the punch-through effect. The threshold may have to rise substantially before punch-through has been sufficiently reduced. Finally, the depth of the source junction 50 and the drain junction 48 and 46 can cause buried punch-through phenomenon that cannot be controlled by the presence of the near-surface threshold enhancement region 26.

Several prior art approaches deal with Flash EEPROM devices. U.S. Pat. No. 5,891,774 to Ueda et al discloses a method to form nonvolatile memory cells with a high concentration impurity layer formed adjacent to the drain region. The high concentration impurity layer is formed by an oblique ion implantation. The spacing and height of the gate stack, combined with the implantation angle, masks the implantation from the source region. The oblique angle ion implantation of the drain region is performed to improve channel hot electron programming efficiency. U.S. Pat. No. 5,998,263 to Sekariapuram et al teaches a method to form compact nonvolatile cells in trenches. The floating gate is formed over the trench sidewalls. The source is formed at the bottom of the trench. The drain is formed at the top of the trench. A tilt-angle ion implantation may be used for the voltage threshold implant. U.S. Pat. No. 5,355,006 to Iguchi discloses a method to form a DRAM device. Narrowly-spaced source and drain regions are formed using a two-directional oblique angle ion implantation. The shadowing effect of the gates masks a part of the drain and source regions from the implantation. U.S. Pat. No. 5,190,887 to Tang et al teaches a method to form a nonvolatile memory cell. An angled ion implantation is used to form a doped region adjacent to the drain. The implantation angle is selected so that the device gate stack blocks implantation into the source region. U.S. Pat. No. 5,759,896 to Hsu discloses a method to form a Flash memory cell. The gate stack is etched through on the drain side while etched only to the tunnel oxide on the source side. The source and drain ion implantation therefore forms the drain aligned to the gate stack. The source is therefore formed offset from the gate stack. A subsequent angled ion implantation forms a lightly-doped source region, of same dopant type, adjacent to the source. U.S. Pat. No. 5,770,502 to Lee teaches a method to form a double-diffused drain (DDD) region in a FLASH memory cell. Two angled ion implantation steps are used to form the DDD. The first implant is performed prior to sidewall spacer formation. The second implant is performed after sidewall spacer formation. The gate stack is used to mask implantation into undesired areas. U.S. Pat. No. 5,783,457 to Hsu discloses a method to form Flash memory cells. A first angled ion implantation is used to form a lightly-doped source region. A second angled ion implantation is used to form a counter-doped region adjacent to the drain and underlying the gate. U.S. Pat. No. 5,147,811 to Sakagami teaches a method to form a nonvolatile cell. Implanted regions are formed in both the source and the drain regions. The implanted regions are formed by an angled ion implantation after the gate formation. The implantation is self-aligned to the gate and is not masked. However, such implantation of both source and drain regions will degrade the programming characteristics in the case of a Fowler-Nordheim tunneling cell.

SUMMARY OF THE INVENTION

A principal object of the present invention is to provide an effective and very manufacturable method of fabricating a Flash EEPROM memory cell in the manufacture of an integrated circuit device.

A further object of the present invention is to provide a method of fabricating a Flash EEPROM memory cell with an increased drain to source punch-through voltage.

A yet further object of the present invention is to increase the drain to source punch-through voltage by containing the source junction in a channel stop junction of the same impurity type as the impurity type of the semiconductor substrate.

A still yet further object of the present invention is to form an opposite-type channel stop junction by ion implantation at a non-perpendicular angle.

Another further object of the present invention is to increase the drain to source punch-through voltage while eliminating the threshold voltage ion implantation.

In accordance with the objects of this invention, a new method of fabricating a Flash EEPROM memory cell is achieved. A semiconductor substrate is provided. Ions are optionally implanted into said semiconductor substrate to form threshold enhancement regions of the same type as the semiconductor substrate. A tunneling oxide is formed overlying the semiconductor substrate. A first conductive layer is deposited overlying the tunneling oxide layer. An interpoly dielectric layer, which may comprise silicon dioxide, silicon nitride, or a combination of silicon dioxide and silicon nitride, is deposited overlying the first conductive layer. A second conductive layer is deposited overlying the interpoly dielectric layer. The second conductive layer, the interpoly oxide layer, the first conductive layer, and the tunneling oxide layer are patterned to form control gates and floating gates for the planned Flash EEPROM memory cells. Ions are implanted into the semiconductor substrate to form drain junctions. A mask protects the planned source junctions from the implanting. The drain junctions are of the opposite impurity type as the impurity type of the semiconductor substrate. Ions are implanted into the semiconductor substrate to form source junctions. A mask protects the drain junctions from the implanting. The source junctions are of the opposite impurity type as the impurity type of the semiconductor substrate. Ions are implanted into the semiconductor substrate to form channel stop junctions to complete the Flash EEPROM memory cells in the manufacture of the integrated circuit device. The ion implantation is performed at a non-perpendicular angle with respect to the semiconductor substrate. The channel stop junctions contain the source junctions. The channel stop junctions are of the same impurity type as the impurity type of the semiconductor substrate. A mask protects the drain junctions from the implanting.

BRIEF DESCRIPTION OF THE DRAWINGS

In the accompanying drawings forming a material part of this description, there is shown.

DESCRIPTION OF THE PREFERRED EMBODIMENTS

The embodiment discloses the application of the present invention to the formation of a Flash EEPROM memory cell in the manufacture of an integrated circuit device. It should be clear to those experienced in the art that the present invention can be applied and extended without deviating from the scope of the present invention.

Figure 1:
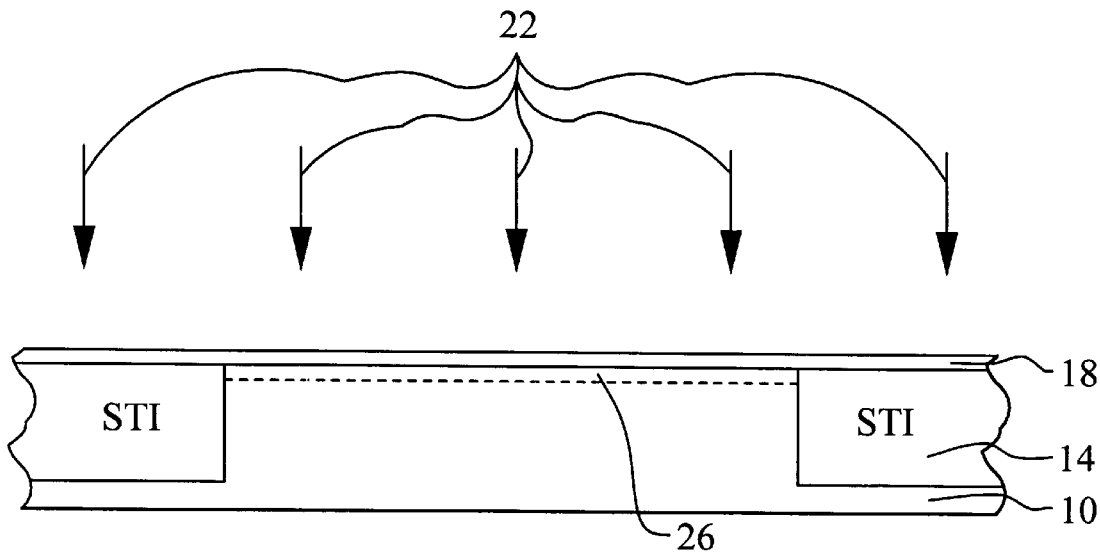
FIGS. 1 and 2 schematically illustrates in cross-sectional representation a partially completed prior art integrated circuit device.
Figure 2:
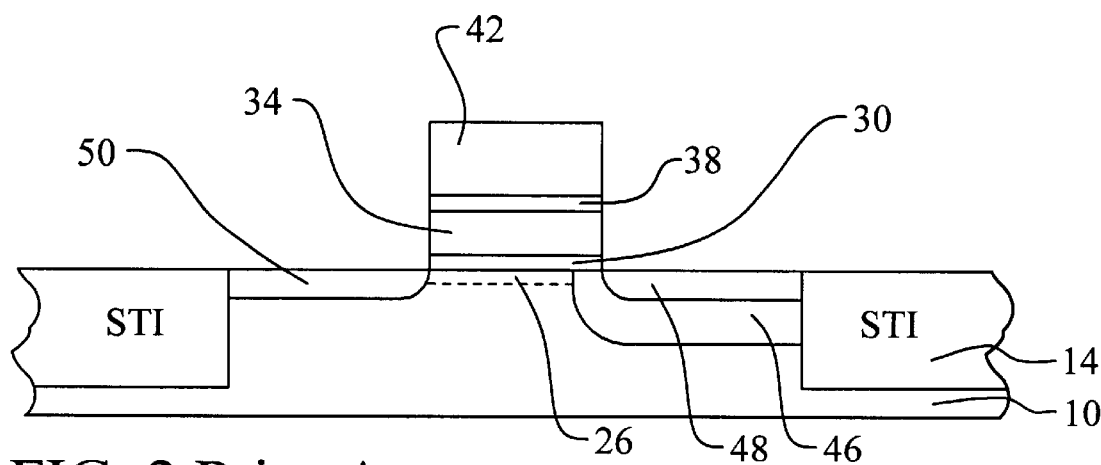
Figure 3:
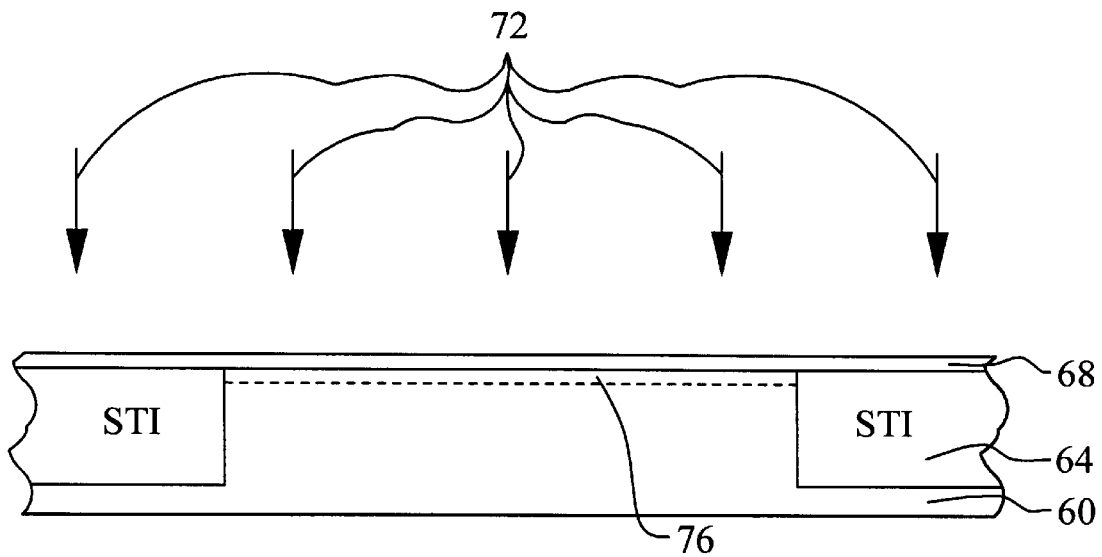
FIGS. 3 through 11 schematically illustrate in cross-sectional representation a preferred embodiment of the present invention.

Referring now particularly to FIG. 3, there is shown a cross section of a partially completed integrated circuit device of the preferred embodiment. A semiconductor substrate 60, typically consisting of monocrystalline silicon, is provided. Isolation regions 64 are formed in the semiconductor substrate 60 to isolate the Flash EEPROM memory cells. Here, shallow trench isolations (STI) 64 are formed in the semiconductor substrate 60. Local oxidation of silicon (LOCOS) structures could likewise be used.

In the preferred embodiment, the semiconductor substrate 60 in the device area further comprises an isolated P-well. The isolated P-well, which is doped p-type, is formed within a deep N-well, which is doped ntype. This well configuration, which is not shown on the cross sectional illustration, provides a p-type substrate in the device area that is isolated from other devices in the semiconductor substrate 60. In the preferred embodiment, therefore, the isolated P-well of the semiconductor substrate 60 has an impurity concentration of between about $1 \times 10^{16}$ atoms/cm$^3$ and $1 \times 10^{17}$ atoms/cm$^3$.

A sacrificial oxide layer 68 is formed overlying the semiconductor substrate 60. The purpose of the sacrificial oxide layer 68 is to prevent surface damage to the semiconductor substrate during the ion implantation. The sacrificial oxide layer 68 preferably comprises silicon dioxide that is grown by thermal oxidation of the semiconductor substrate 60.

An optional ion implantation 72 is performed to form threshold enhancement regions 76 of the same impurity type as the impurity type of the semiconductor substrate 60. The threshold enhancement regions 76 serve two purposes. First, by increasing the impurity concentration of the semiconductor substrate 60 near the surface, the base threshold voltage of the Flash EEPROM memory device can be increased. This base threshold voltage is the turn-on voltage of the device when the floating gate is uncharged. The threshold enhancement implantation allows this threshold voltage to be closely controlled. Second, by increasing the impurity concentration, the drain to source punch-through voltage can be increased. As will be demonstrated, the novel method of the present invention eliminates the need for the threshold implantation for increasing the punch-through voltage. In addition, if the implantation processes of the present invention are optimally chosen, it is possible to eliminate the threshold implantation step entirely. However, if the threshold enhancement is used, the ion implantation would preferably comprise a p-type dopant at a dose of between about $1 \times 10^{13}$ atoms/cm$^2$ and $2 \times 10^{13}$ atoms/cm$^2$ and an energy of between about 20 KeV and 30 KeV.

Figure 4:
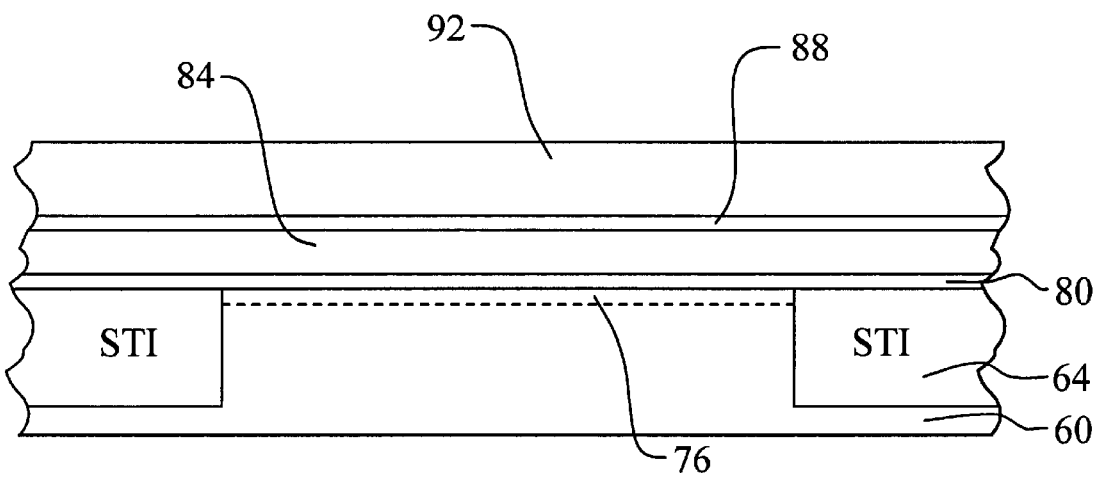

Referring now to FIG. 4, the sacrificial oxide layer 68 is etched away. A tunneling oxide layer 80 is formed overlying the semiconductor substrate 60. The tunneling oxide layer 80 will form both the gate dielectric for the memory cell and will serve as the charge barrier for the floating gate. The tunneling oxide layer 80 preferably comprises silicon dioxide that is either thermally grown or is deposited by a chemical vapor deposition (CVD) process. The tunneling oxide layer 80 is preferably formed to a thickness of between about 90 Angstroms and 100 Angstroms.

A first conductive layer 84 is deposited overlying the tunneling oxide layer 80. The first conductive layer 84 will form the floating gate of the device. The first conductive layer 84 preferably comprises polysilicon that is insitu doped. The first conductive layer 84 is preferably deposited by a low-pressure CVD (LPCVD) process to a thickness of between about 1,000 Angstroms and 2,000 Angstroms.

An interpoly dielectric layer 88 is deposited overlying the first conductive layer 84. The purpose of the interpoly dielectric layer 88 is to act as a dielectric insulator between the floating gate and the control gate. The voltage potential applied to the control gate will be coupled onto the floating gate via the interpoly dielectric layer 88. The interpoly dielectric layer 88 may comprise one or a combination of more than one dielectric materials. In the preferred embodiment, the interpoly dielectric layer 88 comprises a stack of oxide-nitride-oxide (ONO) which is deposited by a CVD processing sequence. The interpoly dielectric layer 88 is deposited to a thickness of between about 150 Angstroms and 250 Angstroms.

A second conductive layer 92 is deposited overlying the interpoly oxide layer 88. The second conductive layer 92 will form the control gate for the memory cell. The second conductive layer 92 preferably comprises polysilicon insitu doped. The second conductive layer 92 is preferably deposited by a low-pressure CVD (LPCVD) process to a thickness of between about 1,000 Angstroms and 3,000 Angstroms.

Figure 5:
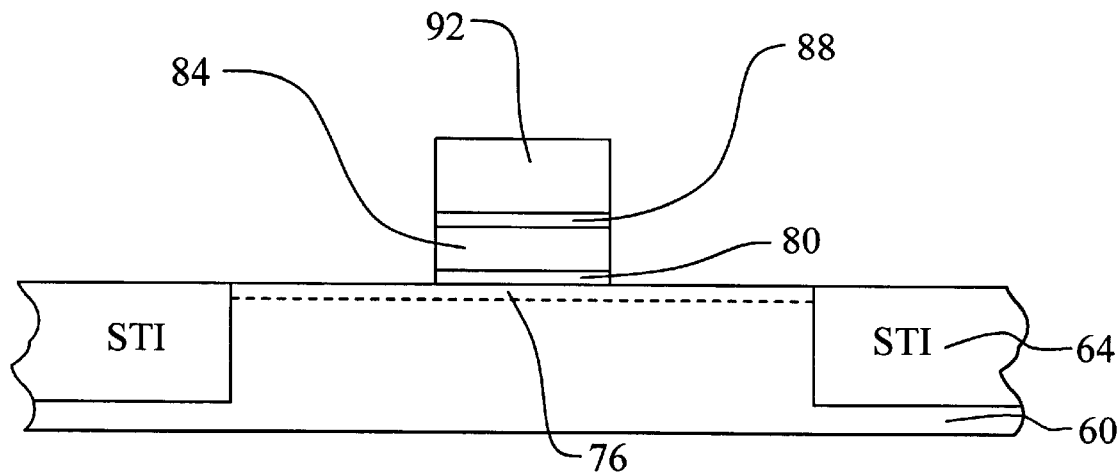

Referring now to FIG. 5, the second conductive layer 92, the interpoly dielectric layer 88, the first conductive layer 84, and the tunneling oxide layer 80 are etched through to form the gate stack. A conventional photoresist mask may be used to allow selective etching of the gate stack. For example, a photoresist layer, that is not shown, is applied overlying the second conductive layer 92. The photoresist layer is patterned by exposure to a light source through a photolithographic mask. The photoresist layer is developed to expose the second conductive layer 92 that is to be etched away. After the etching through step, the remaining photoresist layer is stripped away.

Figure 6:
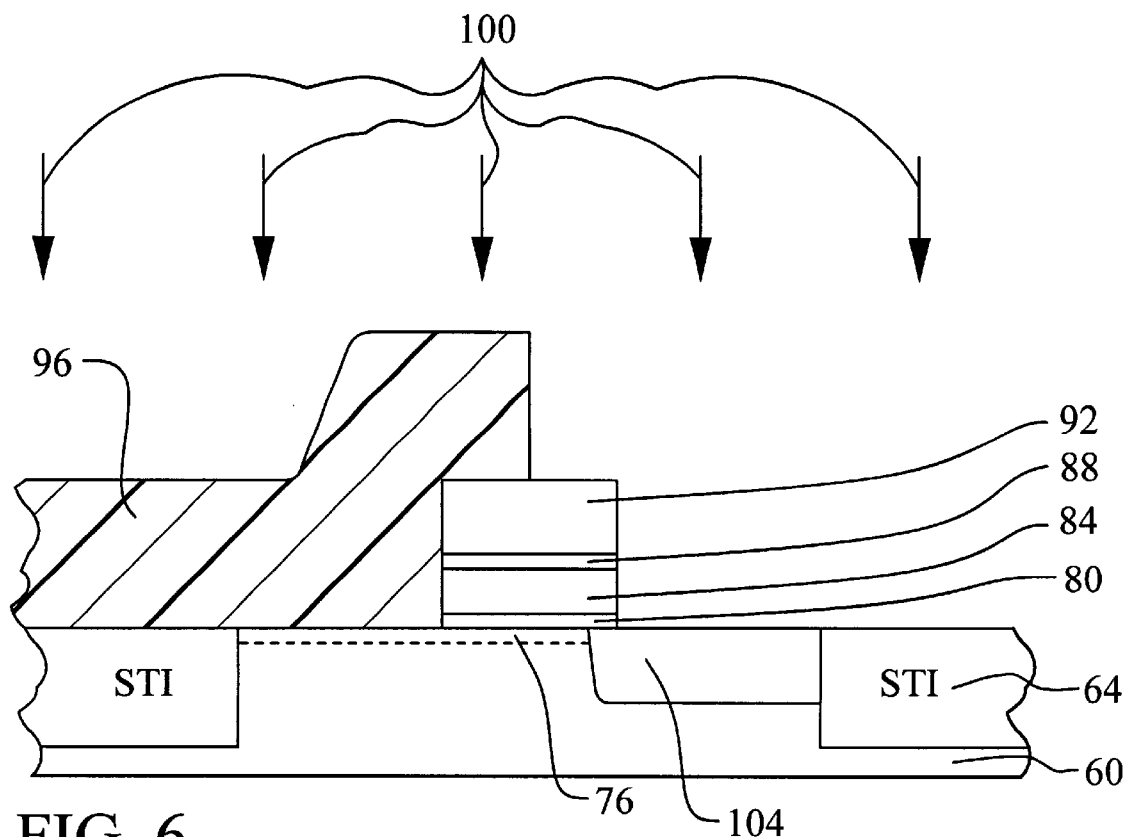

Referring now to FIG. 6, a masking layer 96 is formed overlying the planned source side of the device. The planned drain side is left exposed. The masking layer 96 preferably comprises a first photoresist layer 96 that is deposited overlying the wafer. The first photoresist layer 96 is patterned by, for example, exposure to light through a photolithographic mask. The photoresist layer 96 is then developed to remove the photoresist from the planned drain side of the device.

Ions are implanted 100 to form a deep drain junction 104. In the preferred embodiment, a double diffused drain (DDD) is formed using two implantation steps. A single implanted drain could be used instead. In the DDD case, the first implantation 100 is used to form the deep drain junction 104 of the opposite impurity type as the impurity type of the semiconductor substrate 60. The ion implantation preferably comprises an n-type dopant, such as phosphorous, at a dose of between about $3 \times 10^{14}$ atoms/cm$^2$ and $6 \times 10^{14}$ atoms/cm$^2$ and an energy of between about 50 KeV and 60 KeV. Following the ion implantation 100, an anneal and drive-in thermal cycle may be used to out-diffuse the deep drain junction 104 under the gate stack.

Figure 7:
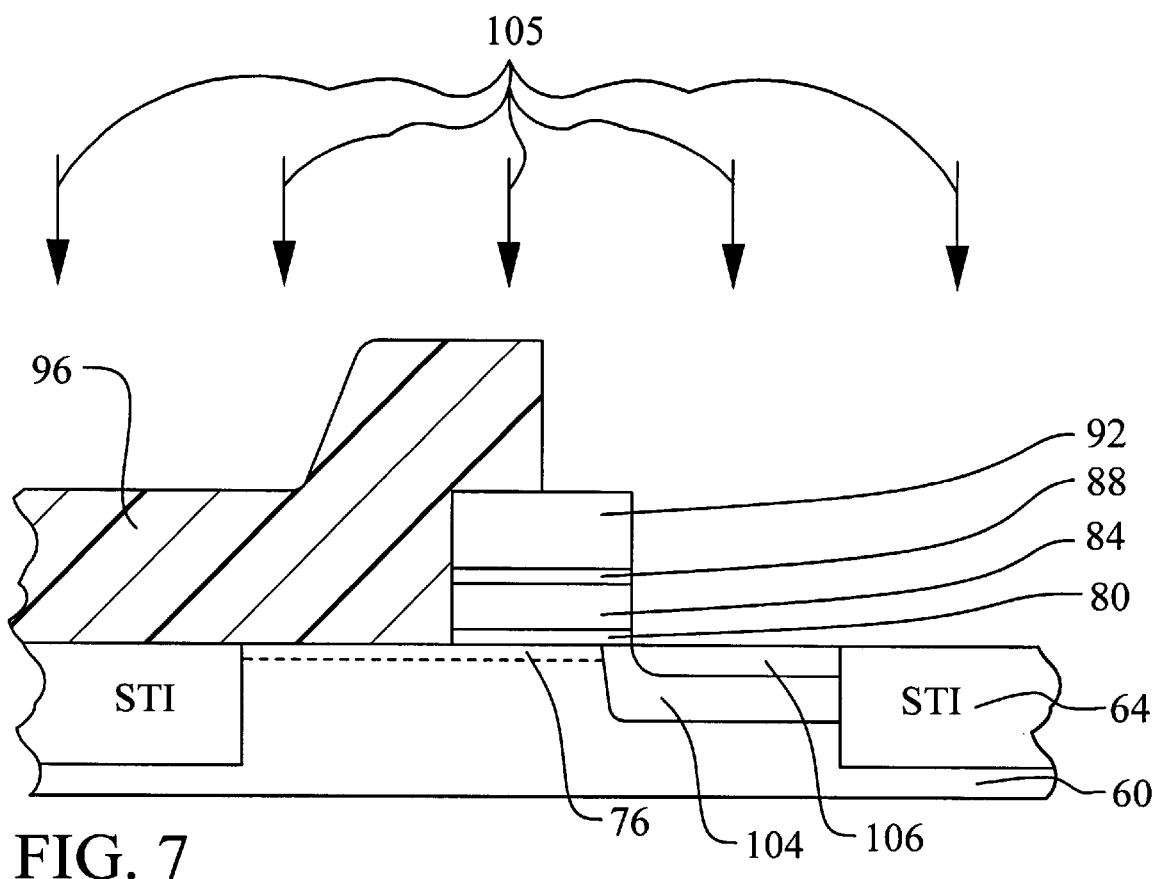

Referring now to FIG. 7, a second ion implantation 105 is performed. Ions are implanted 105 into the semiconductor substrate 60 to form the drain junction 106. The same masking layer 96 may be used for both implants steps. The drain junction 106 is shallower and more heavily-doped than is the deep drain junction 104 of the DDD structure. In the preferred embodiment, the second ion implantation 105 preferably comprises an n-type dopant, such as arsenic, at a dose of between about $2 \times 10^{15}$ atoms/cm$^2$ and $6 \times 10^{15}$ atoms/cm$^2$ and an energy of between about 50 KeV and 60 KeV.

Figure 8:
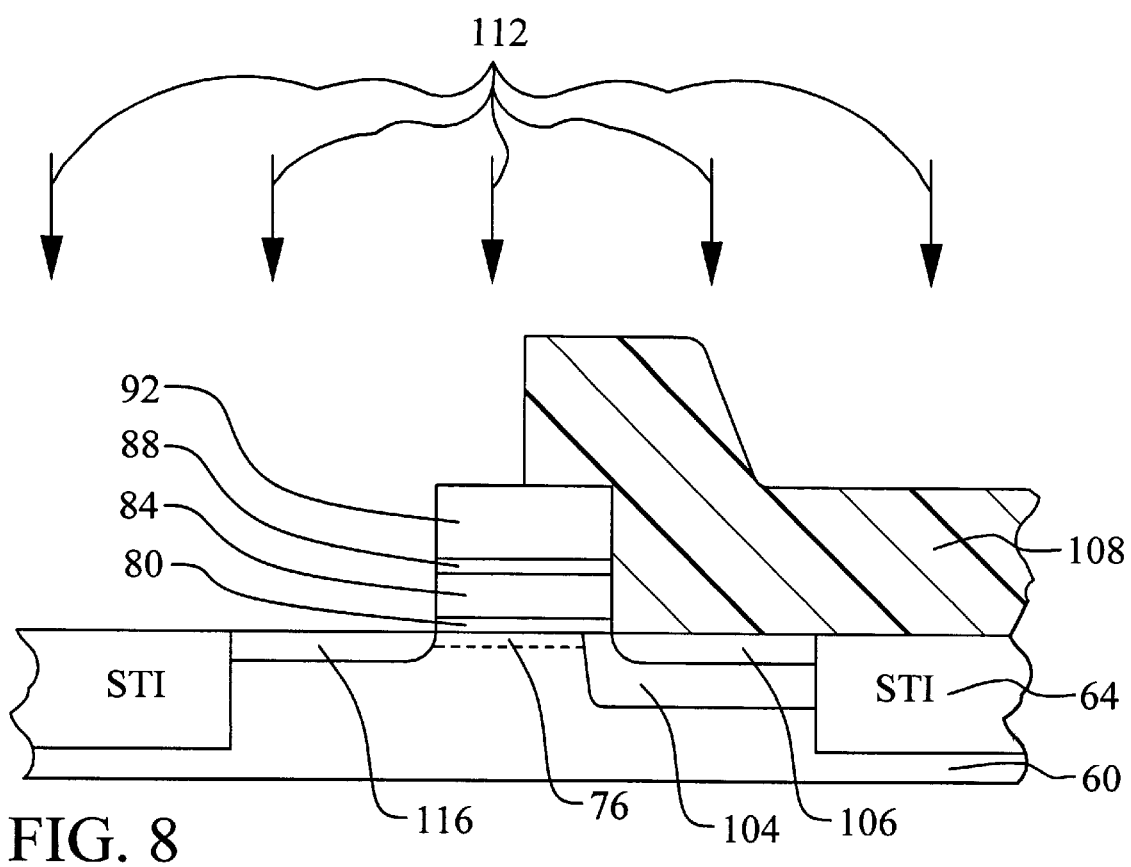

Referring now to FIG. 8, an important feature of the present invention is illustrated. A second masking layer 108 is formed overlying the drain junction 106 of the device while exposing the planned source junction of the device. The second masking layer 108 preferably comprises a second photoresist layer 108 that is deposited overlying the wafer. The second photoresist layer 108 is patterned by, for example, exposure to light through a photolithographic mask. The photoresist layer 108 is then developed to remove the photoresist from the planned source side of the device.

Ions are implanted 112 to form a source junction 116.

The source junction 116 is of the opposite impurity type as the impurity type of the semiconductor substrate 60. The source junction 116 is formed heavily-doped and relatively shallow. The ion implantation preferably comprises an n-type dopant at a dose of between about $2 \times 10^{15}$ atoms/cm$^2$ and $4 \times 10^{15}$ atoms/cm$^2$ and an energy of between about 50 KeV and 60 KeV.

Figure 9:
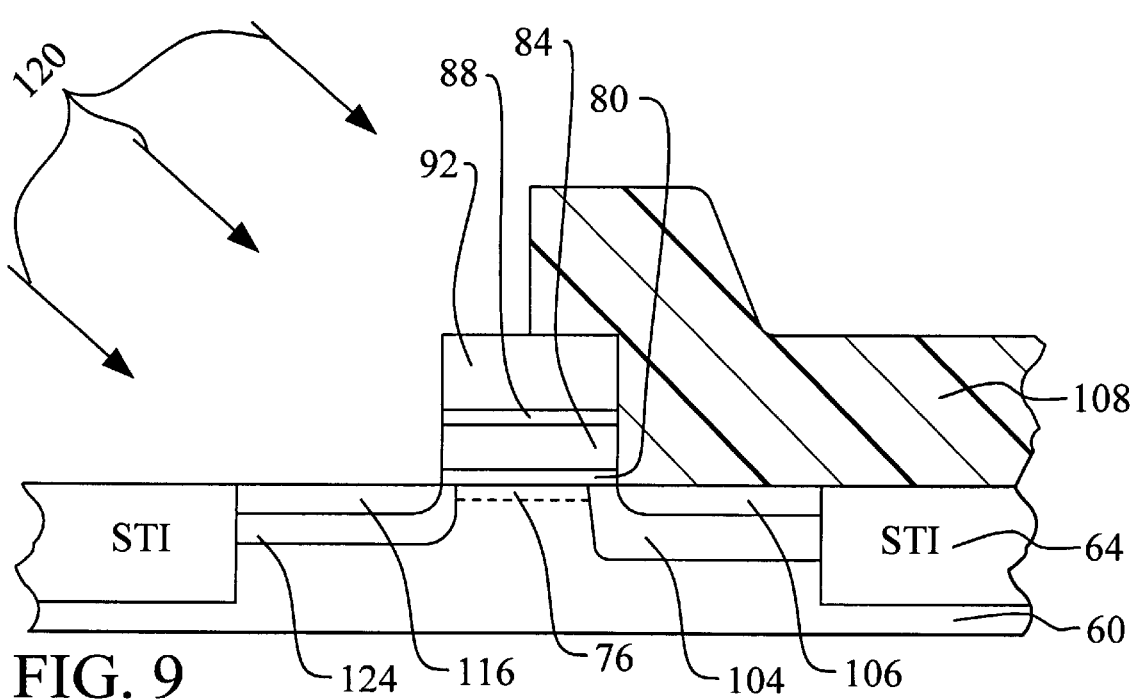

Referring now to FIG. 9, another important feature of the present invention is illustrated. An angled, or tilted-angle, ion implant 120 is performed. The ion implantation 120 forms channel stop junctions 124 in the source region of the device. Note that the same masking layer 108 used for the source implant 112 can be used to mask the channel stop junction implant 120. The ion implantation 120 preferably comprises a p-type dopant at a dose of between about $1 \times 10^{13}$ atoms/cm$^2$ and $2 \times 10^{13}$ atoms/cm$^2$ and an energy of between about 40 KeV and 60 KeV. The channel stop junction 124 has a junction depth of between about 0.25 microns and 0.3 microns. The angled ion implantation 120 is performed at a non-perpendicular angle with respect to the semiconductor substrate 60 of between about 20 degrees and 30 degrees.

Figure 10:
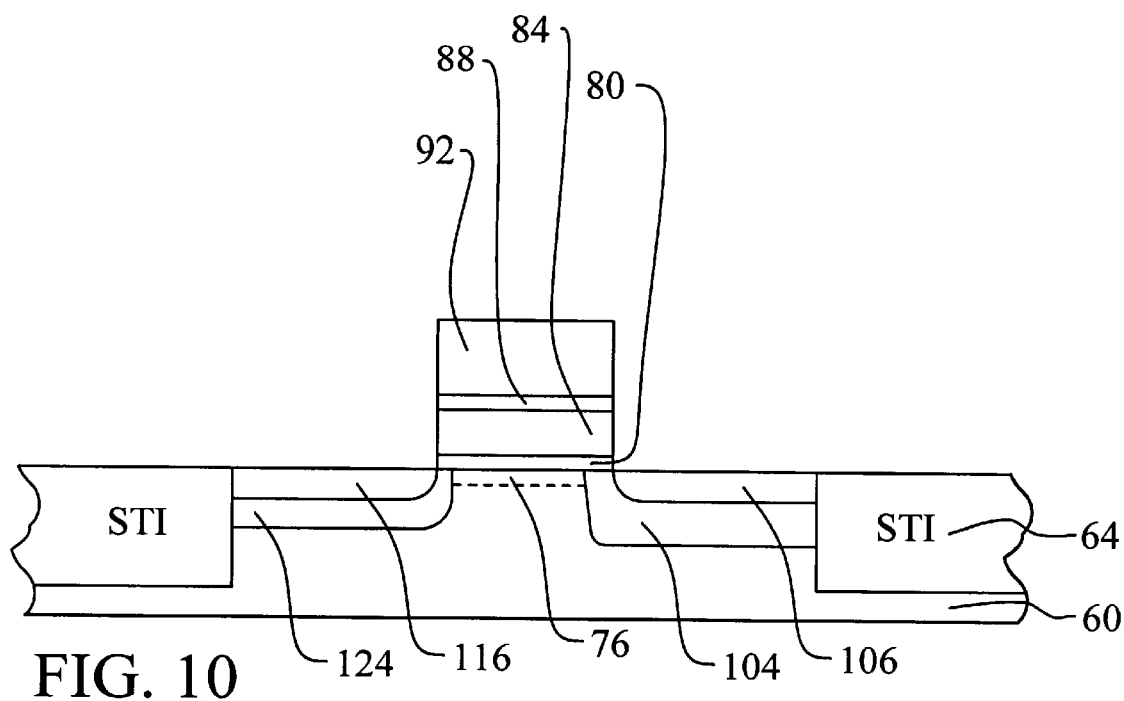

Referring now to FIG. 10, the channel stop junctions 124 so formed have several features. First, the channel stop junctions 124 are formed of the same impurity type as the impurity type of the semiconductor substrate 60. Second, the channel stop junctions 124 are deeper in the semiconductor substrate 60 than the source junctions 116. The channel stop junctions 124 therefore contain the source junctions 116. Third, by implanting at an angle, the channel stop junctions 124 are well under the gate stack of the device. Fourth, because the masking layer 108 covers the drain junctions 106, the channel stop junctions 124 are only formed on the source side.

The presence of the channel stop junction 124 increases the punch-through voltage of the device. Because the channel stop junction 124 is more heavily-doped than the semiconductor substrate 60, a larger voltage is required to deplete the p-type area between the n-type drain and source prior to punch-through current flow. More importantly, since the source junction 116 is contained within the channel stop junction 124, deep substrate, or buried, punch-through is also eliminated for application voltage ranges.

Figure 11:
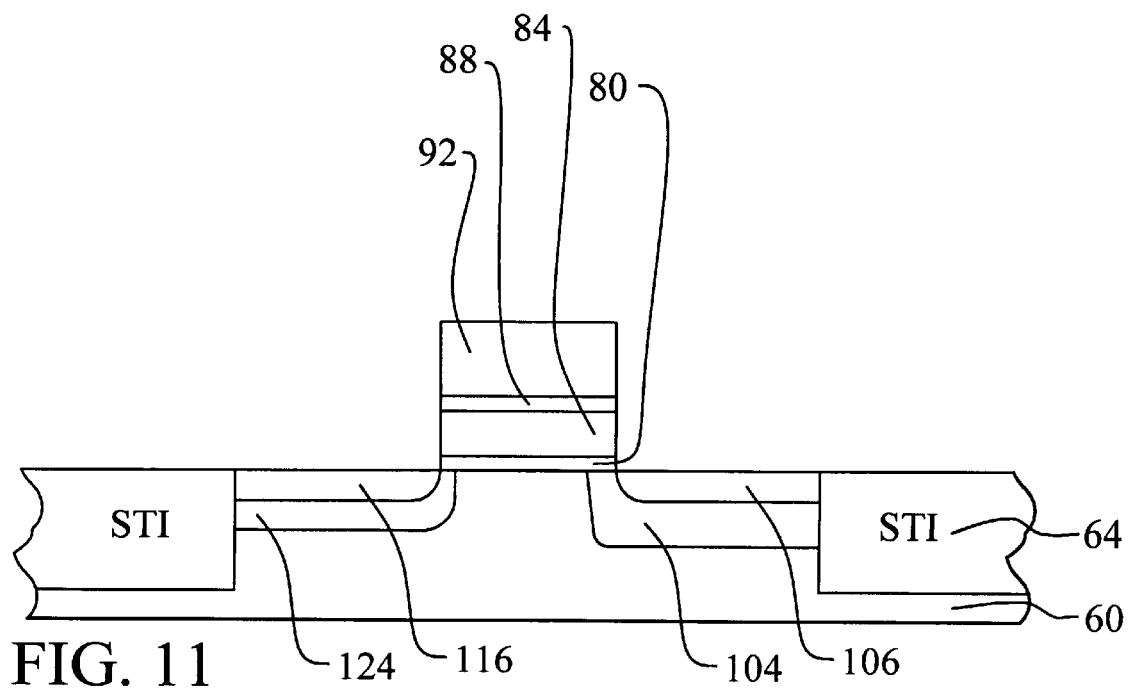

Referring now to FIG. 11, an additional advantage of the present invention is illustrated. Because the presence of the novel source-side channel stop junction 124, improves punch-through performance, a threshold enhancement implant may not be needed. If the channel stop junction 124 is optimized, the base voltage threshold of the device can be established and controlled while punch-through is eliminated. This means that the threshold implant step of FIG. 3 may be eliminated.

As shown in the preferred embodiments, the present invention provides a very manufacturable process for fabricating a Flash EEPROM memory cell in an integrated circuit device. The method produces a Flash EEPROM memory device with improved punch-through performance by forming a source-side channel stop junction. The channel stop junction is formed using an angled ion implantation where the drain junction is masked. The channel stop junction can be optimized to eliminate the threshold implant step.

While the invention has been particularly shown and described with reference to the preferred embodiments thereof, it will be understood by those skilled in the art that various changes in form and details may be made without departing from the spirit and scope of the invention.

What is claimed is:

1. A method to form Flash EEPROM memory cells in the manufacture of an integrated circuit device comprising:

providing a semiconductor substrate;

forming a tunneling oxide layer overlying said semiconductor substrate;

depositing a first conductive layer overlying said tunneling oxide layer;

depositing an interpoly oxide layer is deposited overlying the first conductive layer;

depositing a second conductive layer overlying said interpoly oxide layer;

patterning said second conductive layer, said interpoly dielectric layer, said first conductive layer, and said tunneling oxide layer to form control gates and floating gates for planned Flash EEPROM memory cells;

implanting ions into said semiconductor substrate to form drain junctions wherein a mask protects the planned source junctions from said implanting and wherein said drain junctions are of the opposite impurity type as the impurity type of said semiconductor substrate;

implanting ions into said semiconductor substrate to form source junctions wherein a mask protects said drain junctions from said implanting and wherein said source junctions are of the opposite impurity type as the impurity type of said semiconductor substrate; and implanting ions into said semiconductor substrate to form channel stop junctions to complete said Flash EEPROM memory cells in the manufacture of an integrated circuit device wherein said implanting is performed at an non-perpendicular angle with respect to said semiconductor substrate, wherein said channel stop junctions contain said source junctions, wherein said channel stop junctions are of the same impurity type as the impurity type of said semiconductor substrate, and wherein a mask protects said drain junctions from said implanting.

2. The method according to claim 1 wherein said step of implanting ions to form said threshold enhancement regions comprises a dose of between about $1\times10^{13}$ atoms/cm$^2$ and $2\times10^{13}$ atoms/cm$^2$ and energy of between about 20 KeV and 30 KeV.

3. The method according to claim 1 wherein said step of implanting ions to form said drain junctions comprises phosphorous ions at a dose of $3\times10^{14}$ atoms/cm$^2$ and $6\times10^{14}$ atoms/cm$^2$ and energy of between about 50 KeV and 60 KeV and arsenic ions at a dose of $2\times10^{15}$ atoms/cm$^2$ and $6\times10^{15}$ atoms/cm$^2$ and energy of between about 50 KeV and 60 KeV.

4. The method according to claim 1 wherein said step of implanting ions to form said source junctions comprises a dose of between about $4\times10^{15}$ atoms/cm$^2$ and $6\times10^{15}$ atoms/cm$^2$ and energy of between about 50 KeV and 60 KeV.

5. The method according to claim 1 wherein said step of implanting ions to form said channel stop junctions comprises a dose of between about $1\times10^{13}$ atoms/cm$^2$ and $2\times10^{13}$ atoms/cm$^2$ and an energy of between about 40 KeV and 60 KeV.

6. The method according to claim 1 wherein said non-perpendicular angle of implantation comprises an angle of between about 20 degrees and 30 degrees with respect to said semiconductor substrate.

7. The method according to claim 1 further comprising implanting ions into said semiconductor substrate to form deep drain junctions wherein a mask protects the planned source junctions from said implanting, wherein said deep drain junctions are of the opposite impurity type as the impurity type of said semiconductor substrate, and wherein said deep drain junctions contain said drain junctions.

8. The method according to claim 1 further comprising implanting ions into said semiconductor substrate to form threshold enhancement regions of the same impurity type as said impurity type of said semiconductor substrate prior to said step of forming a tunneling oxide layer overlying said semiconductor substrate.

9. A method to form Flash EEPROM memory cells in the manufacture of an integrated circuit device comprising:

providing a semiconductor substrate;

implanting ions into said semiconductor substrate to form a threshold enhancement regions of the same impurity type as the impurity type of the semiconductor substrate;

forming a tunneling oxide layer overlying said semiconductor substrate;

depositing a first conductive layer overlying said tunneling oxide layer;

depositing an interpoly oxide layer is deposited overlying the first conductive layer;

depositing a second conductive layer overlying said interpoly oxide layer;

patterning said second conductive layer, said interpoly dielectric layer, said first conductive layer, and said tunneling oxide layer to form control gates and floating gates for planned Flash EEPROM memory cells;

implanting ions into said semiconductor substrate to form deep drain junctions wherein a mask protects the planned source junctions from said implanting and wherein said deep drain junctions are of the opposite impurity type as the impurity type of said semiconductor substrate;

implanting ions into said semiconductor substrate to form drain junctions wherein a mask protects the planned source junctions from said implanting, wherein said drain junctions are of the opposite impurity type as the impurity type of said semiconductor substrate, and wherein said deep drain junctions contain said drain junctions;

implanting ions into said semiconductor substrate to form source junctions wherein a mask protects said drain junctions from said implanting and wherein said source junctions of the opposite impurity type as the impurity type of said semiconductor substrate; and implanting ions into said semiconductor substrate to form channel stop junctions to complete said Flash EEPROM memory cells in the manufacture of an integrated circuit device wherein said implanting is performed at an non-perpendicular angle with respect to said semiconductor substrate, wherein said channel stop junctions contain said source junctions, wherein said channel stop junctions of the same impurity type as the impurity type of said semiconductor substrate, and wherein a mask protects said drain junctions from said implanting.

10. The method according to claim 9 wherein said step of implanting ions to form said threshold enhancement regions comprises a dose of between about $1\times10^{13}$ atoms/cm$^2$ and $2\times10^{13}$ atoms/cm$^2$ and energy of between about 20 KeV and 30 KeV.

11. The method according to claim 9 wherein said step of implanting ions to form said deep drain junctions comprises phosphorous ions at a dose of between about $3\times10^{14}$ atoms/cm$^2$ and $6\times10^{14}$ atoms/cm$^2$ and energy of between about 50 KeV and 60 KeV and arsenic ions at a dose of between about $2\times10^{15}$ atoms/cm$^2$ and $6\times10^{15}$ atoms/m$^2$ and energy of between about 50 KeV and 60 KeV.

12. The method according to claim 9 wherein said step of implanting ions to form said drain junctions comprises arsenic ions at a dose of between about $2\times10^{15}$ atoms/cm$^2$ and $6\times10^{15}$ atoms/cm$^2$ and energy of between about 50 KeV and 60 KeV.

13. The method according to claim 9 wherein said step of implanting ions to form said source junctions comprises a dose of $2\times10^{15}$ atoms/cm$^2$ and $4\times10^{15}$ atoms/cm$^2$ and energy of between about 50 KeV and 60 KeV.

14. The method according to claim 9 wherein said step of implanting ions to form said channel stop junctions comprises a dose of $1\times10^{13}$ atoms/cm$^2$ and $2\times10^{13}$ atoms/cm$^2$ and an energy of between about 40 KeV and 60 KeV.

15. The method according to claim 9 wherein said non-perpendicular angle of implantation comprises an angle of between about 20 degrees and 30 degrees with respect to said semiconductor substrate.

16. A method to form Elash EEPROM memory cells in the manufacture of an integrated circuit device comprising:

providing a semiconductor substrate;

forming a tunneling oxide layer overlying said semiconductor substrate;

depositing a first conductive layer overlying said tunneling oxide layer;

depositing an interpoly oxide layer is deposited overlying the first conductive layer;

depositing a second conductive layer overlying said interpoly oxide layer;

patterning said second conductive layer, said interpoly dielectric layer, said first conductive layer, and said tunneling oxide layer to form control gates and floating gates for planned Flash EEPROM memory cells;

implanting ions into said semiconductor substrate to form drain junctions wherein a mask protects the planned source junctions from said implanting and wherein said drain junctions are of the opposite impurity type as the impurity type of said semiconductor substrate;

implanting ions into said semiconductor substrate to form source junctions wherein a mask protects said drain junctions from said implanting and wherein said source junctions are of the opposite impurity type as the impurity type of said semiconductor substrate; and implanting ions into said semiconductor substrate to form channel stop junctions to complete said Flash EEPROM memory cells in the manufacture of an integrated circuit device wherein said implanting is performed at an non-perpendicular angle with respect to said semiconductor substrate, wherein said channel stop junctions contain said source junctions, wherein said channel stop junctions are of the opposite impurity type as the impurity type of said semiconductor substrate, wherein a mask protects said drain junctions from said implanting, and wherein said channel stop junctions eliminate the need to implant threshold enhancement regions.

17. The method according to claim 16 wherein said step of implanting ions to form said drain junctions comprises phosphorous ions at a dose of between about $3\times10^{14}$ atoms/cm$^2$ and $6\times10^{14}$ atoms/cm$^2$ and energy of between about 50 KeV and 60 KeV and arsenic ions at a dose of between about $2\times10^{15}$ atoms/cm$^2$ and $6\times10^{15}$ atoms/cm$^2$ and energy of between about 50 KeV and 60 KeV.

18. The method according to claim 16 wherein said step of implanting ions to form said channel stop junctions comprises a dose of $1\times10^{13}$ atoms/cm$^2$ and $2\times10^{13}$ atoms/cm$^2$ and an energy of between about 40 KeV and 60 KeV.

19. The method according to claim 15 wherein said non-perpendicular angle of implantation comprises an angle of between about 20 degrees and 30 degrees with respect to said semiconductor substrate.

20. The method according to claim 15 further comprising implanting ions into said semiconductor substrate to form deep drain junctions wherein a mask protects the planned source junctions from said implanting, wherein said deep drain junctions are of the opposite impurity type as the impurity type of said semiconductor substrate, and wherein said deep drain junctions contain said drain junctions.

* * * * *

UNITED STATES PATENT AND TRADEMARK OFFICE
CERTIFICATE OF CORRECTION

PATENT NO.   : 6,284,603 B1
DATED        : September 4, 2001
INVENTOR(S)  : Chan Tze Ho (Simon), Tyrone Philip Stodart, Sung Rae Kim and Yung-Tao Lin It is certified that error appears in the above-identified patent and that said Letters Patent is hereby corrected as shown below:

Title page,
Item [75], delete "Chan Tze Ho Simon" and replace with -- Chan Tze Ho (Simon) --.

Signed and Sealed this

Sixteenth Day of April, 2002

Attest:

Attesting Officer

JAMES E. ROGAN
*Director of the United States Patent and Trademark Office*